(12) United States Patent
Tian et al.

(10) Patent No.: US 11,335,870 B2
(45) Date of Patent: May 17, 2022

(54) DISPLAY SUBSTRATE AND PREPARATION METHOD THEREOF, AND DISPLAY DEVICE

(71) Applicant: BOE Technology Group Co., Ltd., Beijing (CN)

(72) Inventors: Hongwei Tian, Beijing (CN); Yanan Niu, Beijing (CN); Meng Zhao, Beijing (CN); Pinfan Wang, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 137 days.

(21) Appl. No.: 16/920,769

(22) Filed: Jul. 6, 2020

(65) Prior Publication Data

US 2021/0066625 A1 Mar. 4, 2021

(30) Foreign Application Priority Data

Aug. 27, 2019 (CN) .......................... 201910798123.7

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/5253* (2013.01); *H01L 2227/323* (2013.01); *H01L 2227/326* (2013.01)

(58) Field of Classification Search
CPC ............. H01L 51/0097; H01L 27/3276; H01L 51/5253; H01L 2227/323; H01L 2227/326;

(Continued)

(56) References Cited

U.S. PATENT DOCUMENTS

| 8,748,958 B1 | 6/2014 | Lee et al. |
| 2018/0090699 A1* | 3/2018 | Shin ........................ H01L 51/56 |
| 2018/0350840 A1 | 12/2018 | Tian |

FOREIGN PATENT DOCUMENTS

| CN | 105932030 A | 9/2016 |
| CN | 106057864 A | 10/2016 |

(Continued)

OTHER PUBLICATIONS

Office Action dated Apr. 19, 2021 for Chinese Patent Application No. 201910798123.7 and English Translation.

*Primary Examiner* — Kyoung Lee
(74) *Attorney, Agent, or Firm* — Ling Wu; Stephen Yang; Ling and Yang Intellectual Property

(57) ABSTRACT

Provided is a method for preparing a display substrate. The display substrate includes multiple pixel island regions, empty regions and connection bridge regions. The preparation method includes: forming first grooves corresponding to the pixel island regions and second grooves corresponding to the connection bridge regions on a side of a hard underlay substrate; preparing the display substrate on a side of the underlay substrate where the first grooves and the second grooves are formed, wherein the pixel island regions are located in regions where the first grooves are located, the connection bridge regions are located in regions where the second grooves are located, and the empty regions are located in regions other than the first grooves and the second grooves; and separating the underlay substrate from the display substrate to obtain the display substrate.

20 Claims, 8 Drawing Sheets

(58) Field of Classification Search
CPC . H01L 51/0017; H01L 51/003; H01L 27/156;
H01L 27/3241; H01L 33/52; H01L 51/56;
H01L 2933/005; Y02E 10/549; Y02P
70/50
See application file for complete search history.

(56) References Cited

FOREIGN PATENT DOCUMENTS

| | | |
|---|---|---|
| CN | 109755412 A | 5/2019 |
| CN | 109860244 A | 6/2019 |
| CN | 109935730 A | 6/2019 |

* cited by examiner

DISPLAY SUBSTRATE AND PREPARATION METHOD THEREOF, AND DISPLAY DEVICE

CROSS-REFERENCE TO RELATED APPLICATION

The present application claims the priority of Chinese patent application No. 201910798123.7 filed to the CNIPA on Aug. 27, 2019, the content of which is hereby incorporated by reference.

TECHNICAL FIELD

The present disclosure relates to, but is not limited to the technical field of display, specifically to a display substrate and a preparation method thereof, and a display device.

BACKGROUND

An organic electro luminescent display (OLED/LED for short) panel has gradually become the mainstream in the display field due to its excellent performances such as low power consumption, high color saturation, wide view, thin thickness and a capability for achieving flexibility. The OLED/LED panel can be widely applied in smart phones, tablet computers, televisions and other terminal products. Among them, flexible OLED/LED products are the most prominent, and gradually become the mainstream of the OLED/LED display as they can meet various special structures.

SUMMARY

The following is a summary of subject matter described in detail herein. This summary is not intended to limit the protection scope of the claims.

In an aspect, an embodiment of the present disclosure provides a display substrate. The display substrate includes a base substrate, multiple pixel island regions disposed on the base substrate, empty regions disposed between adjacent pixel island regions, and connection bridge regions connecting adjacent pixel island regions, wherein each pixel island region of the multiple pixel island regions is provided with a light emitting unit, a distance between a surface of a side of the base substrate away from the light emitting unit and a surface of a side of the base substrate facing the light emitting unit in the pixel island region is a first distance, a distance between a surface of a side of the base substrate away from the light emitting unit and a surface of a side of the base substrate facing the light emitting unit in the connection bridge region is a second distance, and the first distance is not equal to the second distance.

In some possible implementations, the surface of the side of the base substrate facing the light emitting unit in the pixel island region and the surface of the side of the base substrate facing the light emitting unit in the connection bridge region are in a same plane, and the first distance is greater than the second distance.

In some possible implementations, the surface of the side of the base substrate facing the light emitting unit in the pixel island region and the surface of the side of the base substrate facing the light emitting unit in the connection bridge region are in a same plane, and the first distance is smaller than the second distance.

In some possible implementations, the display substrate further includes an encapsulation structure layer, disposed in the pixel island region, for encapsulating the light emitting unit, and the encapsulation structure layer in each pixel island region is independent of each other.

In another aspect, an embodiment of the present disclosure provides a method for preparing a display substrate. The display substrate includes multiple pixel island regions, empty regions disposed between adjacent pixel island regions, and connection bridge regions connecting adjacent pixel island regions. The method for preparing a display substrate includes: providing a hard underlay substrate; forming first grooves and second grooves on a side of the hard underlay substrate, wherein the first grooves correspond to the pixel island regions and the second grooves correspond to the connection bridge regions; preparing the display substrate on a side of the underlay substrate where the first grooves and the second grooves are formed, wherein the pixel island regions are located in regions where the first grooves are located, the connection bridge regions are located in regions where the second grooves are located, and the empty regions are located in regions other than the first grooves and the second grooves; and separating the underlay substrate from the display substrate to obtain the display substrate.

In some possible implementations, forming the first grooves and the second grooves on the side of the hard underlay substrate includes: forming the first grooves and the second grooves by laser cauterization or etching.

In some possible implementations, a depth of the first grooves is greater than a depth of the second grooves.

In some possible implementations, a depth of the second grooves is greater than a depth of the first grooves.

In some possible implementations, preparing the display substrate on the side of the underlay substrate where the first grooves and the second grooves are formed includes: coating a flexible material on the side of the underlay substrate where the first grooves and the second grooves are formed, curing the flexible material into a film to form a base substrate; preparing driving structures in the pixel island regions and connection lines in the connection bridge regions on the base substrate; preparing light emitting units on a side of the driving structures away from the base substrate, wherein the light emitting units are located in the pixel island regions; and forming encapsulation structure layers on a side of the light emitting units away from the base substrate, wherein the encapsulation structure layers are located in the pixel island regions.

In some possible implementations, the base substrate has a first thickness corresponding to the first grooves, a second thickness corresponding to the second grooves, and a third thickness corresponding to regions other than the first grooves and the second grooves, the first thickness is 4 µm to 15 µm, the second thickness is 3 µm to 12 µm, and the third thickness is 0 µm to 10 µm.

In some possible implementations, the base substrate has a first thickness corresponding to the first grooves, a second thickness corresponding to the second grooves, and a third thickness corresponding to regions other than the first grooves and the second grooves, the first thickness is 4 µm to 12 µm, the second thickness is 5 µm to 15 µm, and the third thickness is 0 µm to 10 µm.

In some possible implementations, forming the encapsulation structure layers on the side of the light emitting units away from the base substrate includes: forming first inorganic thin films on the side of the light emitting units away from the base substrate, patterning the first inorganic thin films through a patterning process, removing the first inorganic thin films located in the connection bridge regions and the empty regions, and forming first inorganic encapsulation layers in the pixel island regions; forming organic encapsulation layers on the first inorganic encapsulation layers by ink-jet printing; and forming second inorganic films on the organic encapsulation layers, patterning the second inorganic films through a patterning process, removing the second inorganic films located in the connection bridge regions and the empty regions, and forming second inorganic encapsulation layers in the pixel island regions.

In a further aspect, an embodiment of the present disclosure further provides a display device. The display device includes a display substrate, the display substrate includes a base substrate, multiple pixel island regions disposed on the base substrate, empty regions disposed between adjacent pixel island regions, and connection bridge regions connecting adjacent pixel island regions, each pixel island region of the multiple pixel island regions is provided with a light emitting unit, a distance between a surface of a side of the base substrate away from the light emitting unit and a surface of a side of the base substrate facing the light emitting unit in the pixel island region is a first distance, a distance between a surface of a side of the base substrate away from the light emitting unit and a surface of a side of the base substrate facing the light emitting unit in the connection bridge region is a second distance, and the first distance is not equal to the second distance.

In some possible implementations, the surface of the side of the base substrate facing the light emitting unit in the pixel island region and the surface of the side of the base substrate facing the light emitting unit in the connection bridge region are in a same plane, and the first distance is greater than the second distance.

In some possible implementations, the surface of the side of the base substrate facing the light emitting unit in the pixel island region and the surface of the side of the base substrate facing the light emitting unit in the connection bridge region are in a same plane, and the first distance is smaller than the second distance.

In some possible implementations, the display substrate further includes an encapsulation structure layer, disposed in the pixel island region, for encapsulating the light emitting unit, and the encapsulation structure layer in each pixel island region is independent of each other.

Other features and advantages of technical solutions of the present disclosure will be set forth in the description which follows, and in part will become apparent from the description, or be learned by practice of the technical solutions of the present disclosure. Purposes and advantages of the technical solutions of the present disclosure may be realized and obtained by structures specifically pointed out in the specification, claims and drawings.

BRIEF DESCRIPTION OF DRAWINGS

Accompanying drawings are used for providing a further understanding of technical solutions of the present disclosure and form a part of the specification, and explain technical solutions of the present disclosure together with embodiments of the present disclosure, while do not constitute a limitation on the technical solutions of the present disclosure.

DETAILED DESCRIPTION

In order to make purposes, technical solutions and advantages of the present disclosure clearer, embodiments of the present disclosure will be described in detail below with reference to the accompanying drawings. Those skilled in the art should understand that embodiments in the present disclosure and features in the embodiments may be combined with each other arbitrarily if there is no conflict.

Figure 1:
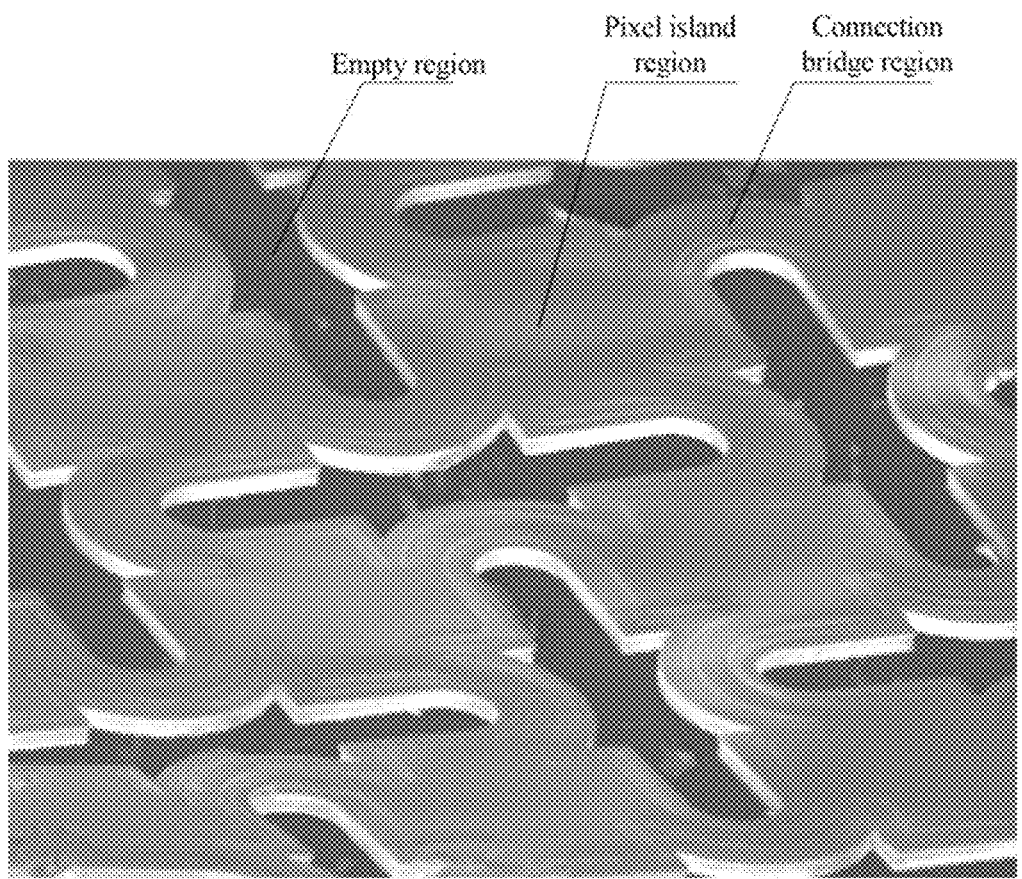
FIG. 1 is a schematic diagram of a stretchable display panel adopting an island-bridge-empty structure in the related art.

With the development of flexible process, a flexible display panel gradually transits from Bendable and Foldable to Stretchable. As the requirements for device flexibility gradually increase, a stretchable panel has come into our view. In the existing stretchable display panel, an island-bridge-empty structure is generally adopted for process design. FIG. 1 is a schematic diagram of a stretchable display panel adopting an island-bridge-empty structure in the existing art. As shown in FIG. 1, the display panel with the island-bridge-empty structure includes multiple pixel island regions, empty regions located between adjacent pixel island regions, and connection bridge regions connecting adjacent pixel island regions, and a light emitting unit is disposed in a pixel island region.

Figure 2:
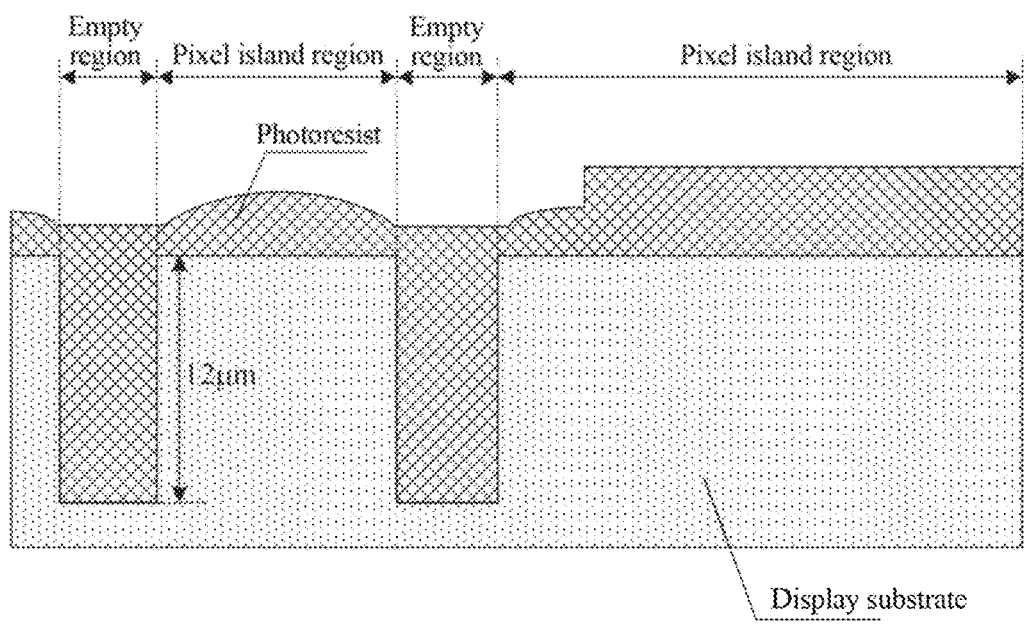
FIG. 2 is a schematic cross-sectional view of a structure of a stretchable display panel.

FIG. 2 is a schematic cross-sectional view of a structure of a stretchable display panel. As shown in FIG. 2, OLED light emitting units are disposed in a left pixel island region and a right pixel island region respectively, and an empty region is disposed between the left pixel island region and the right pixel island region.

To form an empty region, film layers located in the empty region need to be removed in advance, and even a flexible base substrate needs to be removed together. A thickness of the flexible base substrate is generally large (at present, it is generally 10 μm or larger), and an accumulated film thickness in the base substrate preparation process also needs to be considered, therefore, a height difference between the empty region and other regions in the process is relatively large, it may be up to about 12-15 μm, as shown in FIG. 2. In FIG. 2, in a subsequent process, after the photoresist is coated, since the height difference between the empty region and the pixel island region is relatively large and a photoresist film layer in the empty region is relatively thick, photoresist residue is easy to occur in the empty region when the photoresist is removed. In the related process, although a manner that opening a hole in the empty region is delayed has been adopted, it is still necessary to open a hole before formation of a source-drain layer to remove film layers on the substrate and the flexible base substrate at the bottom. After opening a hole, due to the height difference, photoresist residue, organic film residue, metal residue, anode residue and the like commonly occur in the empty region in a later phase of the process, and even a structure shape of a light emitting layer disconnection and encapsulation layer disconnection in the later phase of the process is affected, thus leading to partial poor disconnection and defects. In addition, when the flexible display substrate is stripped off the hard underlay substrate, partial film layer structure is often cracked due to poor stripping process. Moreover, since a shape of a pixel island region needs to be ensured, the pixel island region needs a certain strength, and accordingly, the connection bridge region often needs to retain a corresponding thickness, resulting in a limited flexibility effect of the connection bridge region during stretching.

Figure 3:
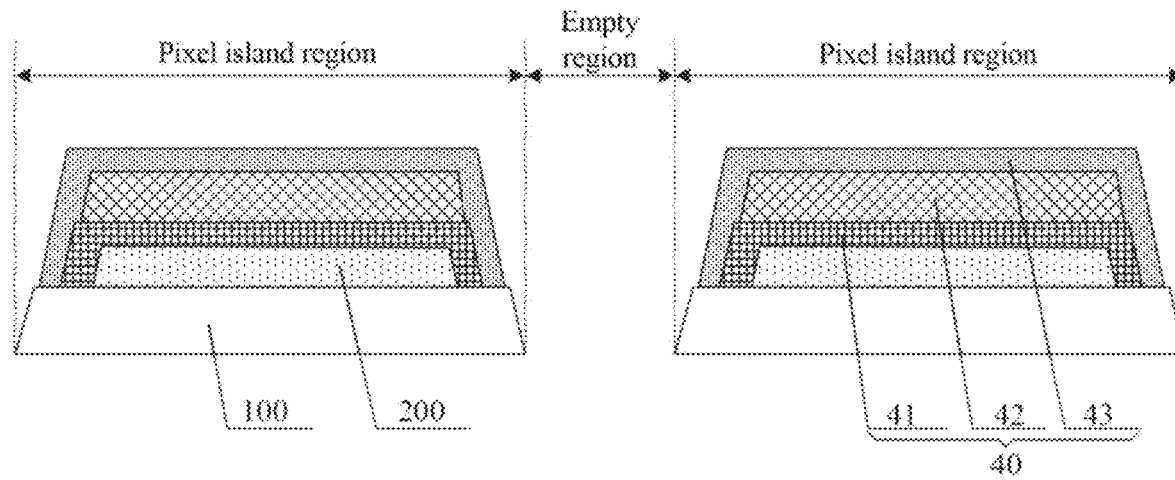
FIG. 3 is a schematic cross-sectional view of a structure of a stretchable display substrate adopting an island-bridge-empty structure.

FIG. 3 is a schematic cross-sectional view of a structure of a stretchable display substrate adopting an island-bridge-empty structure. As shown in FIG. 3, the stretchable display substrate includes pixel island regions, connection bridge regions (not shown) and empty regions. An OLED light emitting unit is located in the pixel island region. The stretchable display substrate includes a flexible base substrate 100, an OLED light emitting unit 200 disposed on the flexible base substrate 100, and an encapsulation structure layer 40 for encapsulating the OLED light emitting unit. The flexible base substrate 100, the OLED light emitting unit 200, and the encapsulation structure layer 40 are all located in pixel island region, and a light emitting layer of the OLED light emitting unit and the encapsulation structure layer are disconnected in the empty region to ensure independence and integrity of the encapsulation structure layer of each pixel island region. In FIG. 3, the encapsulation structure layer 40 includes a first inorganic encapsulation layer 41, an organic encapsulation layer 42, and a second inorganic encapsulation layer 43.

During a process of preparing a stretchable display substrate, there is film layer residue in the empty region due to a large height difference between the empty region and the pixel island region. Residual film layers make a depth of the empty region smaller. In a process of forming the light emitting layer and the encapsulation layer in a later phase, the light emitting layer and the encapsulation layer will be compounded with the residual film layers in the empty region, which will affect disconnections of the light emitting layer and the encapsulation layer, and result in that the light emitting layer and the encapsulation layer cannot be completely disconnected in the empty region, thereby leading to partial poor disconnection and defects.

In order to solve the above technical problems, an embodiment of the present disclosure provides a method for preparing a display substrate. The display substrate includes multiple pixel island regions, empty regions disposed between adjacent pixel island regions, and connection bridge regions connecting adjacent pixel island regions. The method includes: providing a hard underlay substrate; forming first grooves and second grooves on a side of the hard underlay substrate, wherein the first grooves correspond to the pixel island regions and the second grooves correspond to the connection bridge regions; preparing the display substrate on a side of the underlay substrate where the first grooves and the second grooves are formed, wherein the pixel island regions are located in regions where the first grooves are located, the connection bridge regions are located in regions where the second grooves are located, and the empty regions are located in regions other than the first grooves and the second grooves; and stripping the underlay substrate off the display substrate to obtain the display substrate.

According to the method for preparing the display substrate in an embodiment of the present disclosure, the pixel island regions are located in the first grooves and the connection bridge regions are located in the second grooves, therefore, at a side of the underlay substrate where the display substrate is prepared, an upper surface of the underlay substrate in the empty region protrudes from an upper surface of the underlay substrate in the pixel island region and the connection bridge region. Thus, after opening a hole in the empty region, i.e., the film layers located in the empty region are removed, the protruding surface of the empty region can make up for the height difference between the empty region and the pixel island region, as a result, the height difference between the empty region and the pixel island region and the height difference between the empty region and the connection bridge region are greatly reduced. Therefore, photoresist residue, organic film residue, metal residue, anode residue and the like in the empty region can be avoided in the later phase of the process, disconnection of the light emitting layer and disconnection of the encapsulation layer in the later phase of the process are ensured, and defects caused by partial poor disconnection are avoided.

Technical contents of the present disclosure will be described in detail below through exemplary embodiments.

An exemplary embodiment of the present disclosure provides a method for preparing a display substrate. The display substrate includes multiple pixel island regions, empty regions disposed between adjacent pixel island regions, and connection bridge regions connecting adjacent pixel island regions, wherein each pixel island region is provided with a light emitting unit, and connection lines between adjacent pixel islands are disposed in the connection bridge regions.

Figure 4:
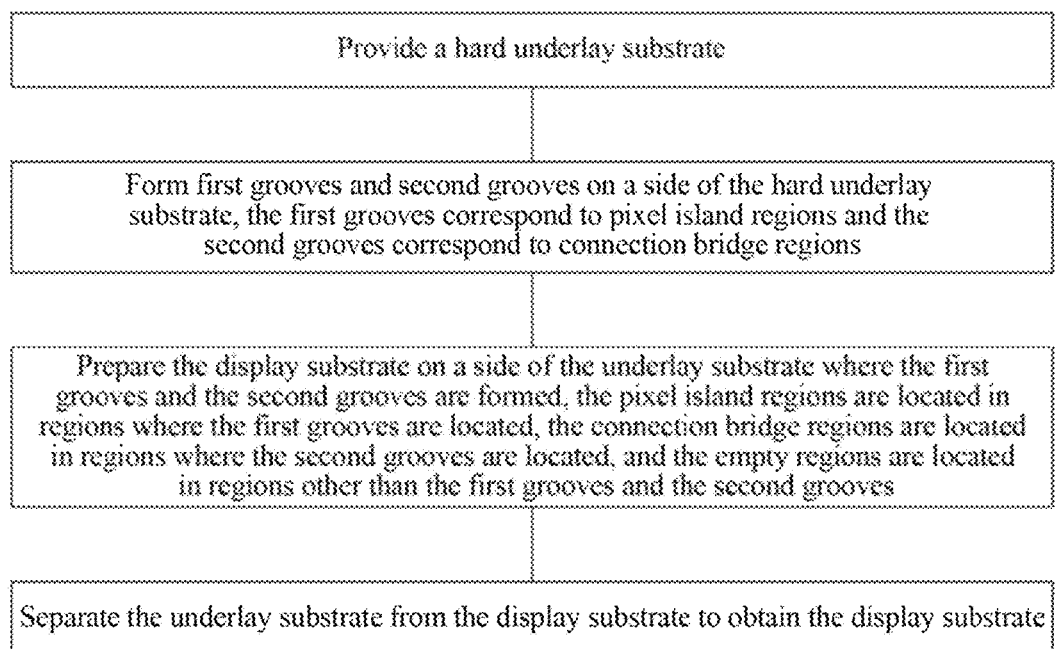
FIG. 4 is a schematic diagram of a method for preparing a display substrate in an exemplary embodiment of the present disclosure.

FIG. 4 is a schematic diagram of a method for preparing a display substrate in an exemplary embodiment of the present disclosure. As shown in FIG. 4, the method for preparing the display substrate includes: providing a hard underlay substrate; forming first grooves 11 and second grooves 12 on a side of the underlay substrate, wherein the first grooves 11 correspond to pixel island regions, the second grooves 12 correspond to connection bridge regions, and regions other than the first grooves 11 and the second grooves 12 of the underlay substrate correspond to empty regions; preparing a display substrate on a side of the underlay substrate where the first grooves 11 and the second grooves 12 are formed, wherein the display substrate includes pixel island regions, the connection bridge regions and the empty regions, the pixel island regions are located in regions where the first grooves 11 are located, the connection bridge regions are located in regions where the second grooves 12 are located, and the empty regions are located in regions other than the first grooves 11 and the second grooves 12; and separating the display substrate from the underlay substrate to obtain the display substrate.

According to the method for preparing a display substrate in an embodiment of the present disclosure, the pixel island regions are located in the first grooves and the connection bridge regions are located in the second grooves, therefore, at a side of the underlay substrate where the display substrate is prepared, an upper surface of the underlay substrate in the empty region protrudes from an upper surface of the underlay substrate in the pixel island region and the connection bridge region. Thus, after opening a hole in the empty region, i.e., the film layers located in the empty region are removed, the protruding surface of the empty region can make up for the height difference between the empty region and the pixel island region, as a result, the height difference between the empty region and the pixel island region and the height difference between the empty region and the connection bridge region are greatly reduced. Therefore, photoresist residue, organic film residue, metal residue, anode residue and the like in the empty region can be avoided in the later phase of the process, disconnection of the light emitting layer and disconnection of the encapsulation layer in the later phase process are ensured, and defects caused by partial poor disconnection are avoided.

The technical solutions of embodiments of the present disclosure are described below in detail through the preparation process of the display substrate. The "patterning process" in this embodiment includes processes, such as, film layer deposition, coating of photoresist, mask exposure, development, etching, stripping of photoresist. The "photolithography process" in this embodiment includes processes, such as, film layer coating, mask exposure, development. The evaporation, deposition, spreading, coating, etc. in this embodiment are mature preparation processes in related technologies.

(1) A hard underlay substrate 10 is provided. The underlay substrate 10 may be a glass underlay substrate or a silicon underlay substrate.

Figure 5:
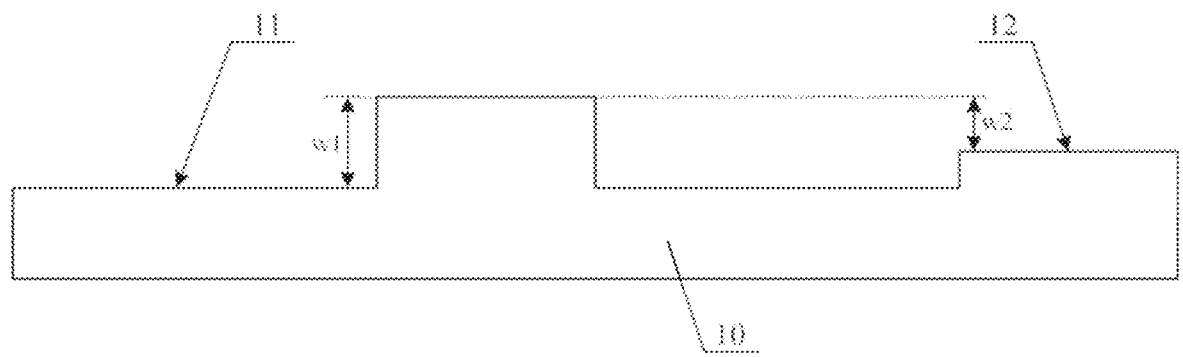
FIG. 5 is a schematic diagram of a structure after a first groove and a second groove are formed on a side of an underlay substrate.

(2) First grooves 11 and second grooves 12 are formed on a side of the underlay substrate 10 (an upper surface side of the underlay substrate 10 in FIG. 5). The first grooves 11 correspond to pixel island regions, the second grooves 12 correspond to connection bridge regions, and regions other than the first grooves 11 and the second grooves 12 correspond to empty regions, as shown in FIG. 5. FIG. 5 is a schematic diagram of a structure after first grooves and second grooves are formed on one side of a underlay substrate. The first grooves and the second grooves 12 may be formed by laser cauterization or gluing-exposure-development-etching. Etching is a common process in the art, and the underlay substrate 10 may be etched by dry etching (using fluorine-containing gas) or wet etching (using fluorine-containing solution) to form the first grooves and the second grooves. A depth of the first grooves 11 is w1, and a depth of the second grooves 12 is w2. In this embodiment, w1>w2. The depth w1 of the first grooves 11 may be 5000 nm to 15000 nm, and the depth w2 of the second grooves 12 may be 2000 nm to 8000 nm. In other embodiments, the depths of the first groove and the second groove may be determined according to actual needs.

(3) A display substrate is prepared on a side of the underlay substrate 10 where the first grooves 11 and the second grooves 12 are formed. The display substrate includes pixel island regions, connection bridge regions and empty regions. The pixel island regions are located in regions where the first grooves 11 are located, the connection bridge regions are located in regions where the second grooves 12 are located, and the empty regions are located in regions other than the first grooves 11 and the second grooves 12.

In an embodiment, preparing the display substrate on the side of the underlay substrate 10 where the first grooves 11 and the second grooves 12 are formed may include the following acts S11-S14.

Figure 6A:
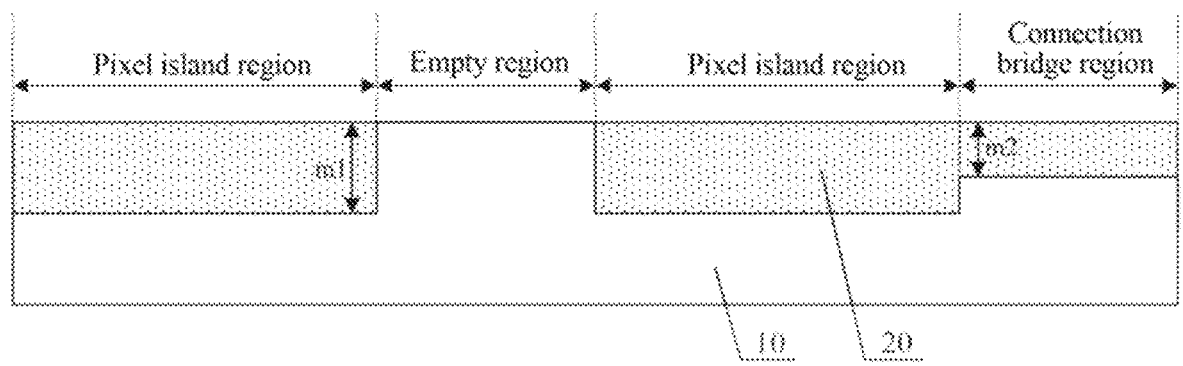
FIG. 6a is a schematic diagram of a structure after a base substrate is formed in a display substrate.

In S11, a flexible material is coated on the side of the underlay substrate 10 where the first grooves 11 and the second grooves 12 are formed, the flexible material is cured to form a film, and a base substrate 20 is formed, as shown in FIG. 6a. FIG. 6a is a schematic diagram of a structure after a base substrate is formed in a display substrate. In an exemplary embodiment, the base substrate 20 may be a flexible base substrate having a first thickness m1 corresponding to the first grooves 11, a second thickness m2 corresponding to the second grooves 12, and a third thickness m3 corresponding to regions other than the first grooves 11 and the second grooves 12. As w1>w2, m1>m2>m3. In an embodiment, the first thickness m1 is 4 μm to 15 μm, the second thickness m2 is 3 μm to 12 μm, the third thickness is 0 μm to 10 μm. In FIG. 6a, m3 is 0. The flexible material may adopt at least one of following materials: polyimide (PI), polyethylene terephthalate (PET) or a surface-treated polymer soft film, etc.

In S12, patterns of a driving structure and a connection line are prepared on the base substrate 20. The driving structure is disposed in the pixel island regions, the connection line is disposed in the connection bridge regions, the driving structure includes multiple gate lines and multiple data lines, the gate lines and the data lines vertically cross to define multiple sub-pixels arranged in a matrix, and each sub-pixel is provided with a thin film transistor. In an exemplary embodiment, the act may include S121-S125 (in an embodiment, the thin film transistor is a top gate type thin film transistor, in other embodiments, the thin film transistor may be a bottom gate type or dual gate type thin film transistor, etc.).

In S121, a barrier film 21' is deposited on the base substrate 20 to form a pattern of a barrier layer 21. The barrier layer may adopt silicon nitride (SiNx), silicon oxide (SiOx) or the like, it may be a single layer or may be a multi-layer structure of the silicon nitride/silicon oxide. The barrier layer 21 is used for improving a capability of water and oxygen resistance of the base substrate 20. A thickness of the barrier film may be 50 nm to 1000 nm.

In S122, an active layer film is deposited on the barrier layer, the active layer film is patterned through a patterning process to form a pattern of the active layer 22 disposed on the barrier layer 21 in the pixel island region. In this patterning process, active layer films in the connection bridge regions and the empty regions are both etched away, retaining the barrier film.

Figure 6B:
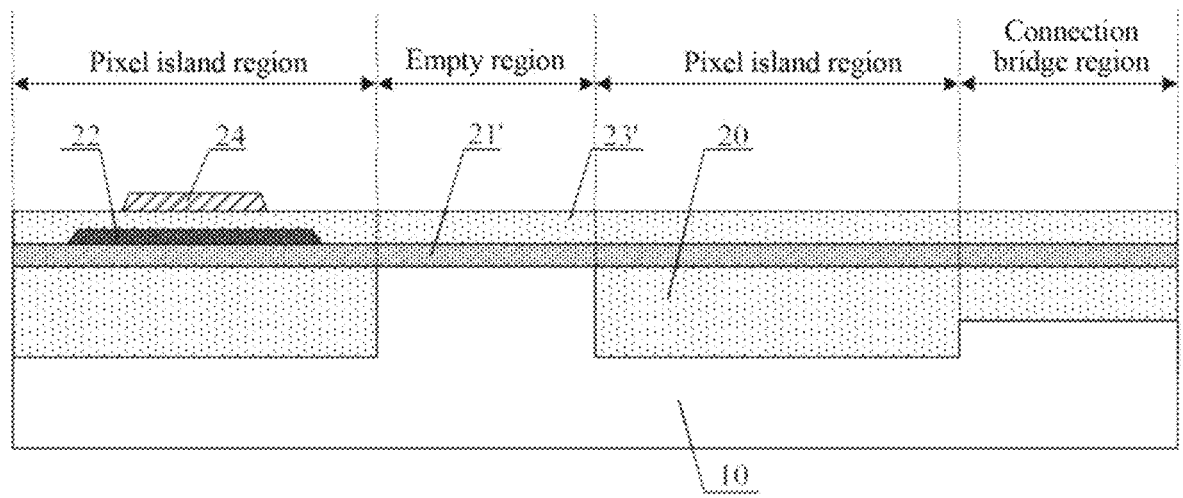
FIG. 6b is a schematic diagram of a structure after a gate electrode is formed in a display substrate.

In S123, a first insulating film 23' and a first metal film are sequentially deposited on a base substrate on which the active layer is formed, and the first metal film is patterned by a patterning process to form patterns of a first insulating layer 23 covering the active layer 22 on the pixel island region, a gate electrode 24 and a gate line (not shown in the figure) disposed on the first insulating layer 23. In this patterning process, the first metal films in the connection bridge regions and the empty regions are etched away, retaining the first insulating film, as shown in FIG. 6b, FIG. 6b is a schematic diagram of a structure after a gate electrode is formed in a display substrate.

Figure 6C:
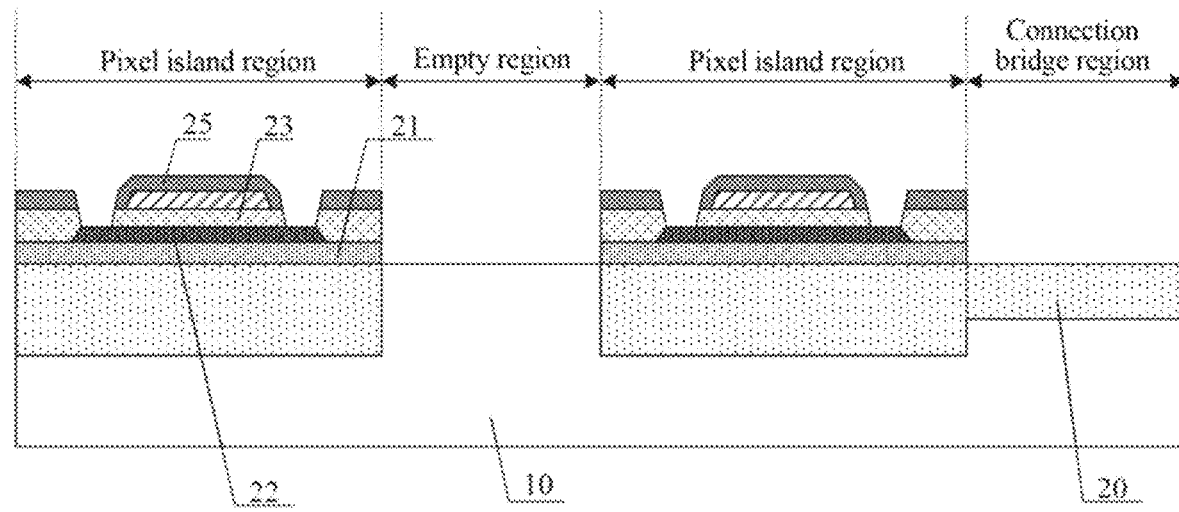
FIG. 6c is a schematic diagram of a structure after a second insulating layer is formed in a display substrate.

In S124, a second insulating film is deposited on a base substrate on which the gate electrode is formed, the second insulating film is patterned through a patterning process to form a second insulating layer 25 with two first vias in the pixel island region, wherein the second insulating film and the first insulating film in the two first vias are etched away to expose the active layer 22. In this patterning process, the second insulating film, the first insulating film and the barrier film in the connection bridge region are all etched away to expose the base substrate 20; the second insulating film, the first insulating film, the barrier film and the base substrate in the empty region are all etched away to expose the underlay substrate 10, as shown in FIG. 6c, FIG. 6c is a schematic diagram of a structure after a second insulating layer is formed in a display substrate. It is easy to understand that if the base substrate 20 is formed in the empty region during the formation of the base substrate 20, the base substrate of the empty region needs to be etched away in this patterning process; if the base substrate 20 is not formed in the empty region during the formation of the base substrate 20, apparently no base substrate of the empty region needs to be etched away in this patterning process.

Figure 6D:
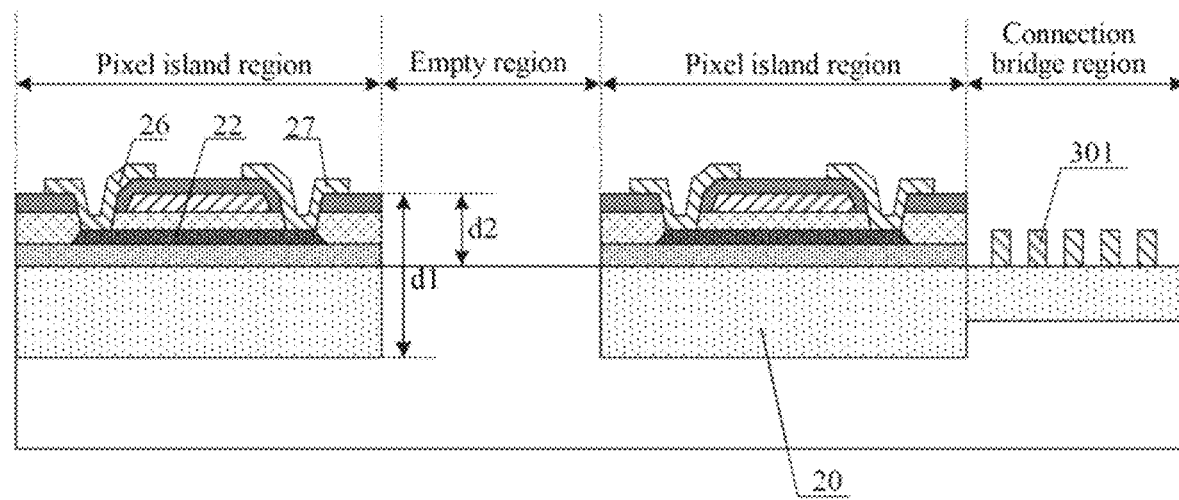
FIG. 6d is a schematic diagram of a structure after a gate electrode, a drain electrode and a connection line are formed in a display substrate.

In S125, a second metal film is deposited on a base substrate where the second insulating layer is formed, and the second metal film is patterned through a patterning process to form patterns of a source electrode 26, a drain electrode 27 and a data line (not shown in the figure) in the pixel island region and form a pattern of connection lines 301 in the connection bridge region, wherein the source electrode 26 and the drain electrode 27 are electrically connected with the active layer 22 through two first vias respectively; and the connection lines 301 are disposed on the base substrate 20. In this patterning process, the second metal film in the empty region is etched away. So far, patterns of the driving structures and the connection lines have been prepared on the base substrate 20, as shown in FIG. 6d. FIG. 6d is a schematic diagram of a structure after a gate electrode, a drain electrode and a connection line are formed in a display substrate.

In the related art, a surface of the hard underlay substrate for preparing the display substrate is a flat surface, i.e., an upper surface of the underlay substrate in the empty region is flush with an upper surface of the pixel island region, after opening a hole in the empty region (i.e., after all the film layers including the base substrate located in the empty region are removed), and before a source-drain layer is formed, a height difference between the empty region and the pixel island region is shown as d1 in FIG. 6d. In this embodiment, as shown in FIG. 6d, since the pixel island region is located in the first groove 11, an upper surface of the empty region protrudes from an upper surface of the pixel island region. As a result, after opening a hole in the empty region (i.e., after all the film layers located in the empty region are removed), and before the source-drain layer is formed, the protruding surface of the empty region can make up for the height difference between the empty region and the pixel island region, so that the height difference between the empty region and the pixel island region is reduced from d1 to d2, as shown in FIG. 6d, obviously d2<d1. Therefore, in the preparation process of the display substrate according to an embodiment of the present disclosure, the height difference between the empty region and the pixel island region is greatly reduced after opening a hole in the empty region, so that photoresist residue, organic film residue, metal residue, anode residue and the like in the empty region can be avoided in the later phase of the process, disconnection of the light emitting layer and disconnection of the encapsulation layer in the later phase of the process are ensured, and defects caused by partial poor disconnection are avoided.

In FIG. 6d, the height difference between the empty region and the pixel island region is reduced to d2, avoiding photoresist residue and second metal film residue in the empty region during the formation of the gate electrodes, drain electrodes and connection lines.

In S13, a light emitting unit is prepared on a base substrate where the driving structure layer is formed, wherein the light emitting unit is located in the pixel island region. The act may include S131-S134.

In S131, a third insulating film is coated on a base substrate 20 where the driving structure layer is formed, and a pattern of a third insulating layer 30 covering the source electrode 26 and the drain electrode 27 is formed in the pixel island region through a mask exposure process and a development process, wherein the third insulating layer 30 is provided with a second via exposing the drain electrode 27. The third insulating layer is also called a planarization layer. In this process, the third insulating films in the connection bridge region and the empty region are developed and removed.

Figure 6E:
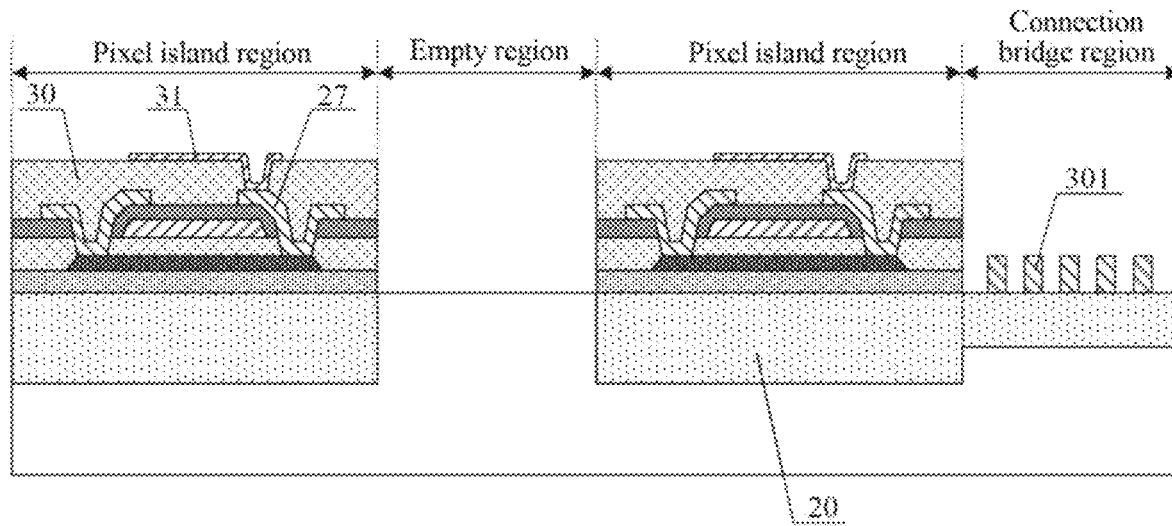
FIG. 6e is a schematic diagram of a structure after an anode is formed in a display substrate.

In S132, a transparent conductive film is deposited on a base substrate where the third insulating layer is formed, the transparent conductive film is patterned through a patterning process to form a pattern of an anode 31 in the pixel island region, wherein the anode 31 is electrically connected with the drain electrode 27 through a second via, as shown in FIG. 6e. FIG. 6e is a schematic diagram of a structure after an anode is formed in a display substrate. The transparent conductive film may adopt indium tin oxide or indium zinc oxide. In this patterning process, the transparent conductive films in the connection bridge region and the empty region are etched away.

Figure 6F:
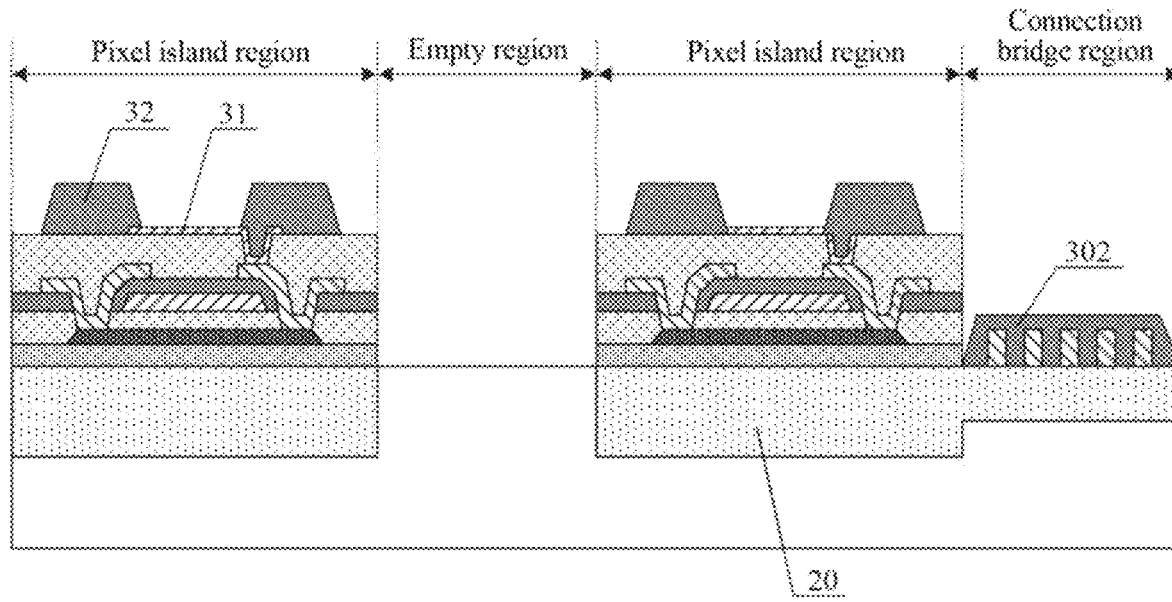
FIG. 6f is a schematic diagram of a structure after a pixel definition layer is formed in a display substrate.

In S133, a pixel definition film is coated on a base substrate where the anode is formed, and a pattern of the pixel definition layer is formed through a photolithography process, wherein the pixel definition layer includes a pattern of a first pixel definition layer 32 located in the pixel island region and a pattern of a second pixel definition layer 302 located in the connection bridge region, namely, the pattern of the first pixel definition layer 32 and the pattern of the second pixel definition layer 302 are formed through one photolithography process, and the first pixel definition layer 32 and the second pixel definition layer 302 adopt the same material. The first pixel definition layer 32 defines a pixel opening region exposing the anode 31 at each sub-pixel, and the second pixel definition layer 302 covers the connection lines 301, as shown in FIG. 6f. FIG. 6f is a schematic diagram of a structure after a pixel definition layer is formed in a display substrate. Herein, the pixel definition layer may adopt polyimide, acrylic or polyethylene terephthalate or the like. In this photolithography process, the pixel definition film in the empty region is developed and removed.

Figure 6G:
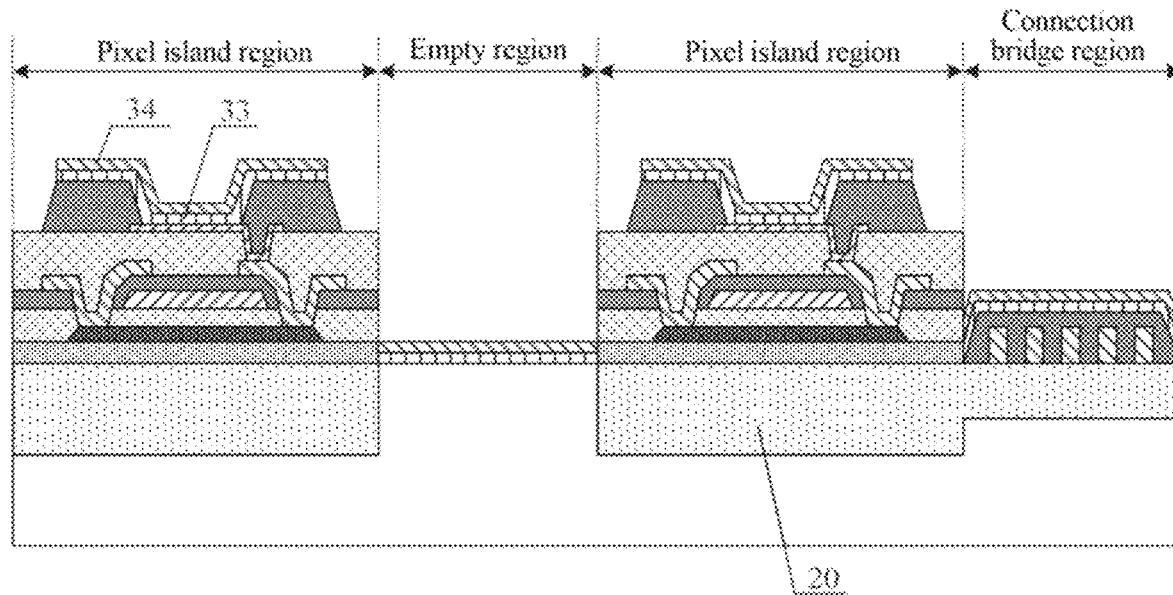
FIG. 6g is a schematic diagram of a structure after a cathode is formed in a display substrate.

In S134, an organic light emitting material and a cathode metal film are sequentially formed on a base substrate where the pixel definition layer is formed to form patterns of an organic light emitting layer 33 and a cathode 34. In the pixel island region, the organic light emitting layer 33 is connected with the anode 31 in the pixel opening region defined by the first pixel definition layer 32, the cathode 34 is disposed on the organic light emitting layer 33, and the organic light emitting layer and the cathode are also formed in the connection bridge region and the empty region, as shown in FIG. 6g. FIG. 6g is a schematic diagram of a structure after a cathode is formed in a display substrate. The organic light emitting layer 33 may include a hole injection layer, a hole transporting layer, a light emitting layer, an electron transporting layer, and an electron injection layer disposed sequentially.

In order to avoid water or oxygen corrosion in the pixel island region, an organic light emitting material and a cathode metal film need to be disconnected from each other in the empty region, the connection island region and the pixel island region. Since the height difference between the empty region and the pixel island region is reduced, the film layers in a previous phase of the process cannot be retained in the empty region, thus avoiding compounding of the organic light emitting material and the cathode metal film with the residual film layers in the empty region, avoiding the affection of the residual film layers on the disconnection structure of the light emitting layer and the cathode, enabling the organic light emitting material and the cathode metal film to be disconnected from each other in the empty region, the connection island region and the pixel island region, and avoiding poor display defects caused by poor disconnections of the organic light emitting material and the cathode metal film.

Figure 6H:
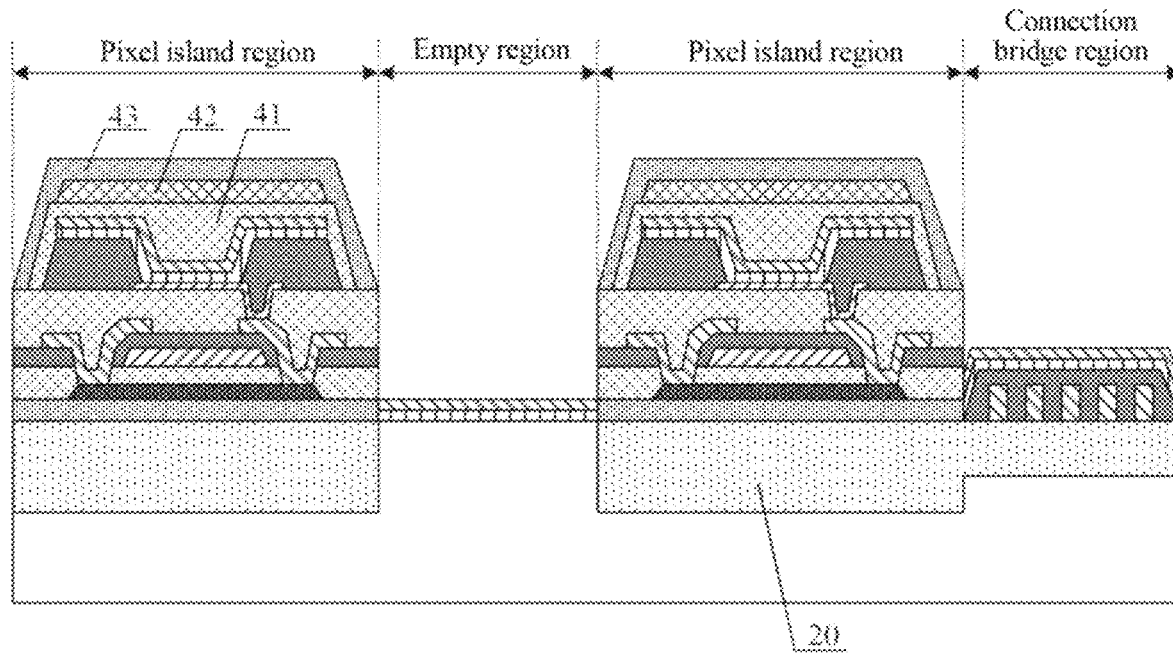
FIG. 6h is a schematic diagram of a structure after an encapsulation structure layer is formed in a display substrate.

In S14, an encapsulation structure layer is formed on a base substrate where the light emitting unit is formed, the encapsulation structure layer is located in the pixel island region, as shown in FIG. 6h. FIG. 6h is a schematic diagram of a structure after a encapsulation structure layer is formed in a display substrate. The act S14 may include S141-S143.

In S141, a first inorganic film is formed on a base substrate where the light emitting unit is formed, the first inorganic film covers the pixel island region, the connection bridge region and the empty region, and the first inorganic film is patterned through a patterning process to form a pattern of a first inorganic encapsulation layer 41 in the pixel island region, as shown in FIG. 6h. In this patterning process, the first inorganic thin films in the connection bridge region and the empty region are etched away.

In S142, an organic encapsulation layer 42 is formed on a base substrate where the first inorganic encapsulation layer is formed, and the organic encapsulation layer 42 is located on the first inorganic encapsulation layer 41 in the pixel island region. In an embodiment, the organic encapsulation layer 42 may be formed by ink-jet printing, and a thickness of the organic encapsulation layer 42 may be 5000 nm to 12000 nm.

In S143, a second inorganic film is formed on a base substrate where the organic encapsulation layer is formed, the second inorganic film covers the pixel island region, the connection bridge region and the empty region, and the second inorganic film is patterned through a patterning process to form a pattern of a second inorganic encapsulation layer 43 in the pixel island region, as shown in FIG. 6h. In this patterning process, the second inorganic thin films in the connection bridge region and the empty region are etched away.

Figure 7:
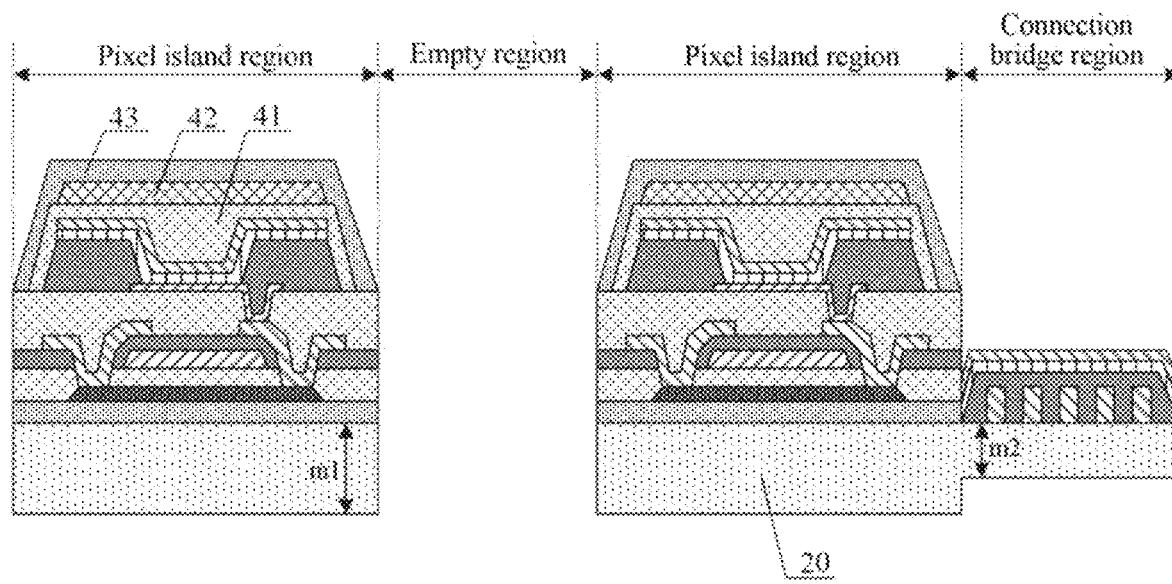
FIG. 7 is a schematic diagram of a structure of a display substrate prepared in an exemplary embodiment of the present disclosure.

(4) Finally, the hard underlay substrate 10 is stripped to form a stretchable OLED display substrate of an embodiment of the present disclosure, as shown in FIG. 7. FIG. 7 is a schematic diagram of a structure of a display substrate prepared in an exemplary embodiment of the present disclosure. Since the organic light emitting layer and the cathode of the empty region are directly formed on the hard underlay substrate 10, the film layers are removed from the empty region at the same time when the hard underlay substrate 10 is stripped.

In the preparation process of the display substrate according to an embodiment of the present disclosure, after opening a hole in the empty region, the height difference between the empty region and the pixel island region is greatly reduced, thus when the first inorganic encapsulation film and the second inorganic encapsulation film located in the empty region are removed through the patterning process, the first inorganic encapsulation film and the second inorganic encapsulation film in the empty region are removed completely, residues of the first inorganic encapsulation film and the second inorganic encapsulation film in the empty region are avoided, affection on a shape of the disconnected structure of the encapsulation layer is avoided, and the display quality of the display substrate is improved.

According to the method for preparing a display substrate in an embodiment of the present disclosure, in the process of preparing the display substrate, the height difference between the empty region and the pixel island region is greatly reduced, and the film layer residue in the empty region is avoided, so that in the process of underlay substrate stripping, cracking of partial film layer structure can be avoided, and the shape and strength of the pixel island region are ensured.

According to the method for preparing a display substrate in an embodiment of the present disclosure, in the process of preparing the display substrate, the first groove is provided in a position of the underlay substrate corresponding to the pixel island region and the second groove is provided in a position of the underlay substrate corresponding to the connection bridge region, so that patterns of flexible base substrates corresponding to the pixel island region, the connection bridge region and the empty region can be obtained. An upper surface of the underlay substrate in the empty region protrudes from an upper surface of the underlay substrate in the pixel island region and an upper surface of the underlay substrate in the connection bridge region, so that the height difference between the empty region and the pixel island region and the height difference between the empty region and the connection bridge region can be reduced in the preparation process, defects caused by the height difference are decreased, and yield of products is improved. In addition, the height difference between the empty region and the pixel island region and the height difference between the empty region and the connection bridge region are reduced, beneficial to the disconnections of the light emitting layer and the encapsulation film in the empty region, improving the reliability of the shape of the disconnection structure of the light emitting layer and the encapsulation layer, ensuring the disconnection effect, and reducing the defects caused by poor disconnections. Moreover, the method for preparing a display substrate in an embodiment of the present disclosure does not affect the preparation process of the display substrate, ensures the thickness of the base substrate in the connection bridge region, improves the yield and reliability of the stretchable structure of the display substrate, and can obtain better yield and process effect.

In addition, according to the method for preparing a the display substrate in an embodiment of the present disclosure, the underlay substrate is provided with the first grooves corresponding to the pixel island regions, which does not change the subsequent process of the display substrate, so that the pixel island region can maintain its fixed structure, and the stability of the circuit of the driving structure in the pixel island region is ensured. The underlay substrate is provided with the second grooves corresponding to the connection bridge regions, and the thickness of the base substrate of the connection bridge region is ensured, so that the connection bridge region has stronger elasticity, thereby facilitating to form a stretchable display substrate with stronger stretchability, and reducing stretch damage caused by insufficient elasticity. The underlay substrate corresponding to the empty region protrudes upward, so that the base substrate corresponding to the empty region is thinner, thus after the film layers and the base substrate of the empty region are removed in the later phase of the process, segment differences between the empty region and the pixel island region and between the empty region and the connection bridge region will not be very great, and the reduction of the height difference avoids the film layer residue in the empty region in the later phase of the process and defects.

A display substrate prepared by the method for preparing the display substrate in the embodiment of the present disclosure is as shown in FIG. 7, the display substrate includes a base substrate 20, multiple pixel island regions spaced apart from each other, empty regions located between adjacent pixel island regions, and connection bridge regions connecting adjacent pixel island regions. A pixel island region is provided with multiple light emitting units. A surface of a side of the base substrate 20 facing the light emitting unit in the pixel island region is flush with a surface of a side of the base substrate 20 facing the light emitting unit in the connection bridge region, that is, the surface of the side of the base substrate 20 facing the light emitting unit in the pixel island region and the surface of the side of the base substrate 20 facing the light emitting unit in the connection bridge region are in the same plane, in other words, the surface of the side of the base substrate 20 facing the light emitting unit in regions other than the empty region is a flat surface. At a side of the base substrate 20 away from the light emitting unit (a lower side of the base substrate 20 in FIG. 7), a base substrate surface corresponding to the pixel island region is not flush with a base substrate surface corresponding to the connection bridge region. That is, a surface of a side of the base substrate 20 away from the light emitting unit in the pixel island region is not flush with a surface of a side of the base substrate 20 away from the light emitting unit in the connection bridge region, in other words, a distance between the surface of the side of the base substrate 20 away from the light emitting unit and the surface of the side of the base substrate 20 facing the light emitting unit in the pixel island region is a first distance, a distance between the surface of the side of the base substrate 20 away from the light emitting unit and the surface of the side of the base substrate 20 facing the light emitting unit in the connection bridge region is a second distance, and the first distance is not equal to the second distance. In FIG. 7, the base substrate surface corresponding to the pixel island region protrudes from the base substrate surface corresponding to the connection bridge region, that is, the base substrate surface corresponding to the pixel island region is farther away from the surface of the base substrate 20 facing the light emitting unit side than the base substrate surface corresponding to the connection bridge region. The base substrate 20 has a first thickness m1 in the pixel island region, and the base substrate 20 has a second thickness m2 in the connection bridge region, m1>m2>0, that is, the first distance is greater than the second distance.

Compared with the base substrate thickness in the connection bridge region being equal to the base substrate thickness in the pixel island region in the related art, in the display substrate prepared by the method for preparing the display substrate in an embodiment of the present disclosure, the base substrate thickness of the connection bridge region is smaller than the base substrate thickness of the pixel island region, and the base substrate thickness of the connection bridge region is ensured, therefore the display substrate prepared in an embodiment of the present disclosure has a better flexibility effect in the stretching process.

Figure 8:
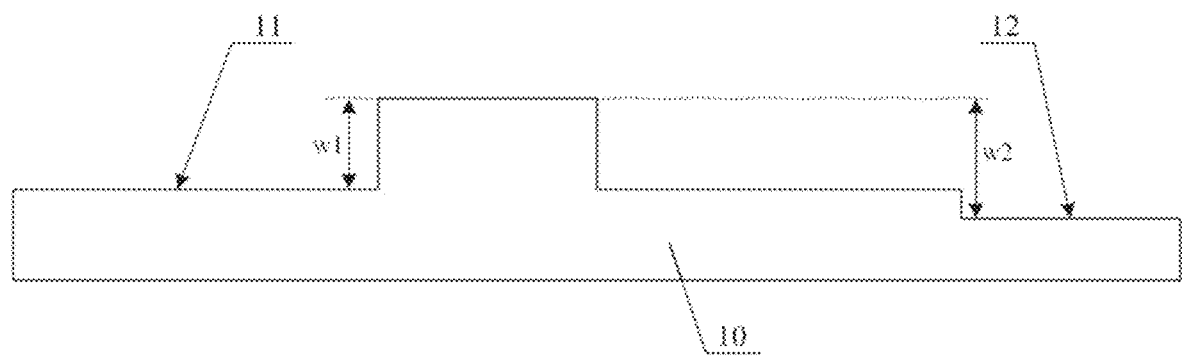
FIG. 8 is a schematic diagram of a structure after a first groove and a second groove are formed on a side of an underlay substrate in an exemplary embodiment of the present disclosure.

FIG. 8 is a schematic diagram of a structure after first grooves and second grooves are formed on a side of an underlay substrate in an exemplary embodiment of the present disclosure. In an exemplary embodiment, as shown in FIG. 8, a depth of the first grooves 11 is w1, and a depth of the second grooves 12 is w2, w1<w2.

Figure 9:
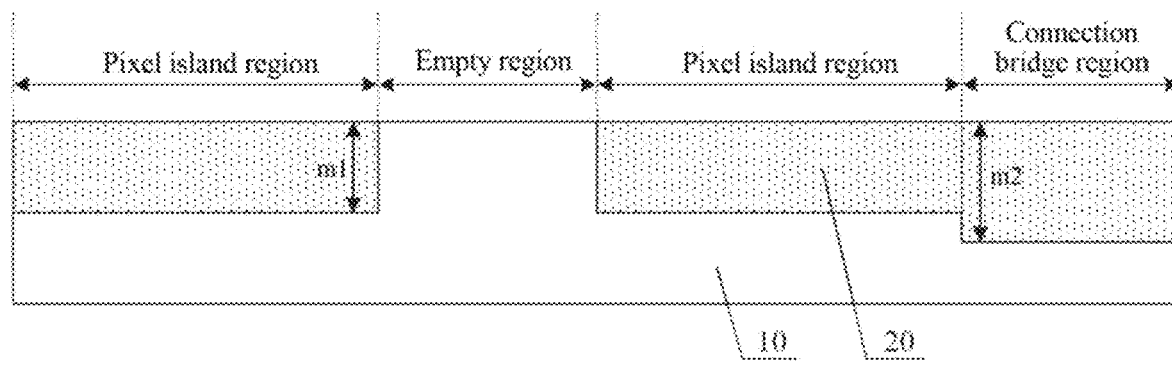
FIG. 9 is a schematic diagram of a structure after a base substrate is formed on an underlay substrate in an exemplary embodiment of the present disclosure.

FIG. 9 is a schematic diagram of a structure after a base substrate is formed on an underlay substrate in an exemplary embodiment of the present disclosure. In an exemplary embodiment, as shown in FIG. 9, the base substrate 20 is a flexible base substrate having a first thickness m1 corresponding to the first grooves 11, a second thickness m2 corresponding to the second grooves 12, and a third thickness m3 corresponding to regions other than the first grooves 11 and the second grooves 12. As w1<w2, m2>m1>m3. In an embodiment, the first thickness m1 is 4 μm to 12 μm, the second thickness m2 is 5 μm to 15 μm, the third thickness is 0 μm to 10 μm. In FIG. 9, m3 is 0. The flexible material may adopt one of polyimide (PI), polyethylene terephthalate (PET) or a surface-treated polymer soft film, etc.

Figure 10:
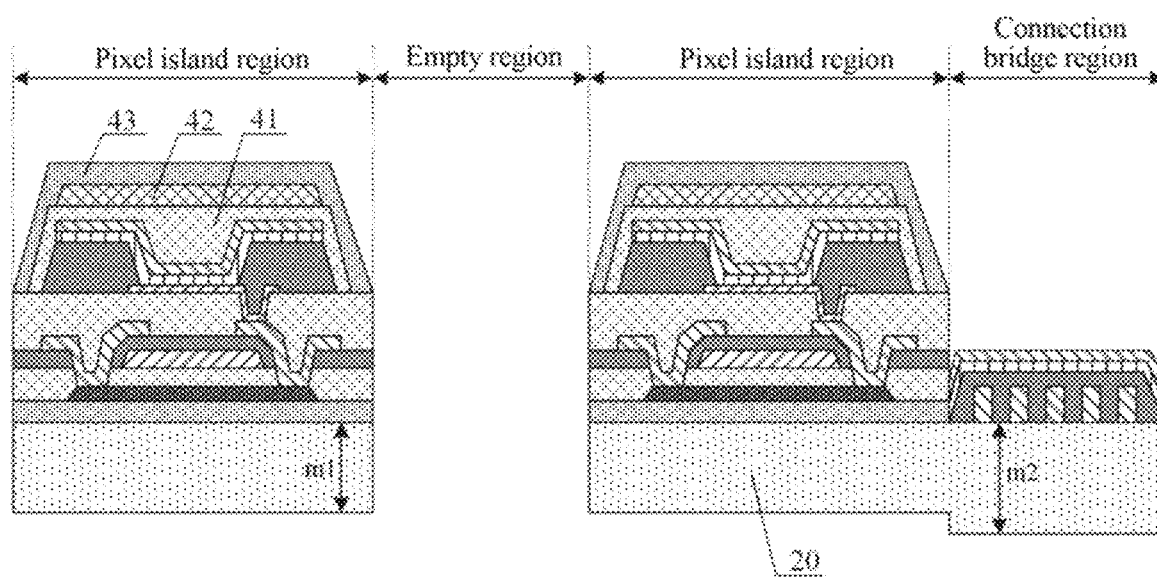
FIG. 10 is a schematic diagram of a structure of a display substrate prepared in an exemplary embodiment of the present disclosure.

FIG. 10 is a schematic diagram of a structure of a display substrate prepared in an exemplary embodiment of the present disclosure. As shown in FIG. 10, the display substrate includes a base substrate 20, and multiple pixel island regions spaced apart from each other disposed on the base substrate 20, empty regions located between adjacent pixel island regions, and connection bridge regions connecting adjacent pixel island regions. A pixel island region is provided with multiple light emitting units. A surface of a side of the base substrate 20 facing the light emitting unit in the pixel island region is flush with a surface of a side of the base substrate 20 facing the light emitting unit in the connection bridge region, that is, the surface of the side of the base substrate 20 facing the light emitting unit in the pixel island region and the surface of the side of the base substrate 20 facing the light emitting unit in the connection bridge region are in the same plane, in other words, the surface of the side of the base substrate 20 facing the light emitting unit in regions other than the empty regions is a flat surface. At a side of the base substrate 20 away from the light emitting unit (a lower side of the base substrate 20 in FIG. 10), a base substrate surface corresponding to the pixel island region is not flush with a base substrate surface corresponding to the connection bridge region. That is, a surface of a side of the base substrate 20 away from the light emitting unit in the pixel island region is not flush with a surface of a side of the base substrate 20 away from the light emitting unit in the connection bridge region, in other words, a distance between the surface of the side of the base substrate 20 away from the light emitting unit and the surface of the side of the base substrate 20 facing the light emitting unit in the pixel island region is a first distance, a distance between the surface of the side of the base substrate 20 away from the light emitting unit and the surface of the side of the base substrate 20 facing the light emitting unit in the connection bridge region is a second distance, and the first distance is not equal to the second distance. In FIG. 10, a base substrate surface corresponding to the connection bridge region protrudes from a base substrate surface corresponding to the pixel island region. The base substrate 20 has a first thickness m1 in the pixel island region, and the base substrate 20 has a second thickness m2 in the connection bridge region, m2>m1>0, that is, the second distance is greater than the first distance.

The display substrate prepared in an embodiment of the present disclosure ensures the thickness of the base substrate in the connection bridge region, and the thickness of the base substrate in the connection bridge region is larger than the thickness of the base substrate in the pixel island region, thus further enhancing the strength of the connection bridge region and avoiding cracking of the connection bridge region of the display substrate in the stretching process.

The present disclosure further provides a display device including a display substrate adopting any aforementioned embodiment. The display device may be any product or component with a display function such as a mobile phone, a tablet computer, a television, a display, a notebook computer, a digital photo frame, a navigator.

In the description of the embodiments of the present disclosure, it need be understood that an orientation or a position relationship indicated by terms "inside", "outside", etc. is based on an orientation or a location relationship shown in the drawings, and this is only for convenience of description of the present application and simplification of description, but does not indicate or imply that the referred device or element must have a specific orientation, be constructed and operated in a specific orientation, and therefore this cannot be understood as a limitation on the present application.

In the description of the embodiments of the present disclosure, it should be noted that unless otherwise explicitly specified and defined, a term "connect" should be understood broadly, for example, it may be an electrical connection; it may be directly connected, or it may be indirectly connected through an intermediate medium, or it may be an internal connection of two elements. For those of ordinary skill in the art, the specific meaning of the above terms in the present application may be understood according to a specific situation.

Although the embodiments disclosed in the present disclosure are as the above, the contents are only embodiments for facilitating understanding the present disclosure but are not used to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising a base substrate, a plurality of pixel island regions disposed on the base substrate, empty regions disposed between adjacent pixel island regions, and connection bridge regions connecting adjacent pixel island regions, wherein each pixel island region of the plurality of pixel island regions is provided with a light emitting unit, a distance between a surface of a side of the base substrate away from the light emitting unit and a surface of a side of the base substrate facing the light emitting unit in the pixel island region is a first distance, a distance between a surface of a side of the base substrate away from the light emitting unit and a surface of a side of the base substrate facing the light emitting unit in the connection bridge region is a second distance, and the first distance is not equal to the second distance.

2. The display substrate according to claim 1, wherein the surface of the side of the base substrate facing the light emitting unit in the pixel island region and the surface of the side of the base substrate facing the light emitting unit in the connection bridge region are in a same plane, and the first distance is greater than the second distance.

3. The display substrate according to claim 1, wherein the surface of the side of the base substrate facing the light emitting unit in the pixel island region and the surface of the side of the base substrate facing the light emitting unit in the connection bridge region are in a same plane, and the first distance is smaller than the second distance.

4. The display substrate according to claim 1, wherein the display substrate further comprises an encapsulation structure layer, disposed in the pixel island region, for encapsulating the light emitting unit, and the encapsulation structure layer in each pixel island region is independent of each other.

5. A method for preparing a display substrate, wherein the display substrate comprises a plurality of pixel island regions, empty regions disposed between adjacent pixel island regions, and connection bridge regions connecting adjacent pixel island regions, and the method comprises:
    providing a hard underlay substrate;
    forming first grooves and second grooves on a side of the underlay substrate, wherein the first grooves correspond to the pixel island regions and the second grooves correspond to the connection bridge regions;
    preparing the display substrate on a side of the underlay substrate where the first grooves and the second grooves are formed, wherein the pixel island regions are located in regions where the first grooves are located, the connection bridge regions are located in regions where the second grooves are located, and the empty regions are located in regions other than the first grooves and the second grooves; and
    separating the underlay substrate from the display substrate to obtain the display substrate.

6. The method according to claim 5, wherein forming the first grooves and the second grooves on the side of the hard underlay substrate comprises: forming the first grooves and the second grooves by laser cauterization or etching.

7. The method according to claim 5, wherein a depth of the first grooves is greater than a depth of the second grooves.

8. The method according to claim 5, wherein a depth of the second grooves is greater than a depth of the first grooves.

9. The method according to claim 5, wherein preparing the display substrate on the side of the underlay substrate where the first grooves and the second grooves are formed comprises:
    coating a flexible material on the side of the underlay substrate where the first grooves and the second grooves are formed and curing the flexible material into a film to form a base substrate;
    preparing driving structures in the pixel island regions and connection lines in the connection bridge regions on the base substrate;
    preparing light emitting units on a side of the driving structures away from the base substrate, wherein the light emitting units are located in the pixel island regions; and forming encapsulation structure layers on a side of the light emitting units away from the base substrate, wherein the encapsulation structure layers are located in the pixel island regions.

10. The method according to claim 9, wherein the base substrate has a first thickness corresponding to the first grooves, a second thickness corresponding to the second grooves, and a third thickness corresponding to regions other than the first grooves and the second grooves, the first thickness is 4 μm to 15 μm, the second thickness is 3 μm to 12 μm, and the third thickness is 0 μm to 10 μm.

11. The method according to claim 9, wherein the base substrate has a first thickness corresponding to the first grooves, a second thickness corresponding to the second grooves, and a third thickness corresponding to regions other than the first grooves and the second grooves, the first thickness is 4 μm to 12 μm, the second thickness is 5 μm to 15 μm, and the third thickness is 0 μm to 10 μm.

12. The method according to claim 9, wherein forming the encapsulation structure layers on the side of the light emitting units away from the base substrate comprises:
forming first inorganic thin films on the side of the light emitting units away from the base substrate, patterning the first inorganic thin films through a patterning process, removing the first inorganic thin films located in the connection bridge regions and the empty regions, and forming first inorganic encapsulation layers in the pixel island regions;
forming organic encapsulation layers on the first inorganic encapsulation layers by ink-jet printing; and
forming second inorganic films on the organic encapsulation layers, patterning the second inorganic films through a patterning process, removing the second inorganic films located in the connection bridge regions and the empty regions, and forming second inorganic encapsulation layers in the pixel island regions.

13. The method according to claim 6, wherein preparing the display substrate on the side of the underlay substrate where the first grooves and the second grooves are formed comprises:
coating a flexible material on the side of the underlay substrate where the first grooves and the second grooves are formed and curing the flexible material into a film to form a base substrate;
preparing driving structures in the pixel island regions and connection lines in the connection bridge regions on the base substrate;
preparing light emitting units on a side of the driving structures away from the base substrate, wherein the light emitting units are located in the pixel island regions; and
forming encapsulation structure layers on a side of the light emitting units away from the base substrate, wherein the encapsulation structure layers are located in the pixel island regions.

14. The method according to claim 13, wherein the base substrate has a first thickness corresponding to the first grooves, a second thickness corresponding to the second grooves, and a third thickness corresponding to regions other than the first grooves and the second grooves, the first thickness is 4 μm to 15 μm, the second thickness is 3 μm to 12 μm, and the third thickness is 0 μm to 10 μm.

15. The method according to claim 13, wherein the base substrate has a first thickness corresponding to the first grooves, a second thickness corresponding to the second grooves, and a third thickness corresponding to regions other than the first grooves and the second grooves, the first thickness is 4 μm to 12 μm, the second thickness is 5 μm to 15 μm, and the third thickness is 0 μm to 10 μm.

16. The method according to claim 13, wherein forming the encapsulation structure layers on the side of the light emitting units away from the base substrate comprises:
forming first inorganic thin films on the side of the light emitting units away from the base substrate, patterning the first inorganic thin films through a patterning process, removing the first inorganic thin films located in the connection bridge regions and the empty regions, and forming first inorganic encapsulation layers in the pixel island regions;
forming organic encapsulation layers on the first inorganic encapsulation layers by ink-jet printing; and
forming second inorganic films on the organic encapsulation layers, patterning the second inorganic films through a patterning process, removing the second inorganic films located in the connection bridge regions and the empty regions, and forming second inorganic encapsulation layers in the pixel island regions.

17. A display device, comprising a display substrate, wherein the display substrate comprises a base substrate, a plurality of pixel island regions disposed on the base substrate, empty regions disposed between adjacent pixel island regions, and connection bridge regions connecting adjacent pixel island regions, each pixel island region of the plurality of pixel island regions is provided with a light emitting unit, a distance between a surface of a side of the base substrate away from the light emitting unit and a surface of a side of the base substrate facing the light emitting unit in the pixel island region is a first distance, a distance between a surface of a side of the base substrate away from the light emitting unit and a surface of a side of the base substrate facing the light emitting unit in the connection bridge region is a second distance, and the first distance is not equal to the second distance.

18. The display device according to claim 17, wherein the surface of the side of the base substrate facing the light emitting unit in the pixel island region and the surface of the side of the base substrate facing the light emitting unit in the connection bridge region are in a same plane, and the first distance is greater than the second distance.

19. The display device according to claim 17, wherein the surface of the side of the base substrate facing the light emitting unit in the pixel island region and the surface of the side of the base substrate facing the light emitting unit in the connection bridge region are in a same plane, and the first distance is smaller than the second distance.

20. The display device according to claim 17, wherein the display substrate further comprises an encapsulation structure layer, disposed in the pixel island region, for encapsulating the light emitting unit, and the encapsulation structure layer of each pixel island region is independent of each other.

* * * * *